US008946794B2

(12) United States Patent
Ahn

(10) Patent No.: US 8,946,794 B2
(45) Date of Patent: Feb. 3, 2015

(54) IMAGE SENSOR

(71) Applicant: Samsung Electronics Co., Ltd., Suwon-Si, Gyeonggi-Do (KR)

(72) Inventor: Jungchak Ahn, Yongin-Si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 13/767,039

(22) Filed: Feb. 14, 2013

(65) Prior Publication Data

US 2013/0320407 A1 Dec. 5, 2013

(30) Foreign Application Priority Data

May 31, 2012 (KW) ........................ 10-2012-0058315

(51) Int. Cl.
*H01L 31/062* (2012.01)
*H01L 31/02* (2006.01)
*H01L 27/146* (2006.01)

(52) U.S. Cl.
CPC .......... *H01L 31/02* (2013.01); *H01L 27/14607* (2013.01); *H01L 27/14609* (2013.01); *H01L 27/1463* (2013.01); *H01L 27/14645* (2013.01); *H01L 27/14689* (2013.01)
USPC ..................... 257/290; 257/239; 257/E27.148

(58) Field of Classification Search
CPC .......................... H01L 27/14612; H01L 31/02
USPC ................... 257/239, 290, E27.148, E27/148
See application file for complete search history.

(56) References Cited

U.S. PATENT DOCUMENTS

| 4,760,273 | A | * | 7/1988 | Kimata ...................... 250/208.1 |
| 7,057,656 | B2 | | 6/2006 | Lee |
| 7,557,846 | B2 | * | 7/2009 | Ohkawa ........................ 348/302 |
| 7,741,143 | B2 | * | 6/2010 | Palk et al. ........................ 438/57 |
| 7,750,281 | B2 | | 7/2010 | Asaba et al. |
| 8,071,455 | B2 | | 12/2011 | Cole et al. |
| 8,445,944 | B2 | * | 5/2013 | Ezaki et al. .................... 257/233 |
| 8,614,759 | B2 | * | 12/2013 | Watanabe et al. ............. 348/315 |
| 2006/0065896 | A1 | * | 3/2006 | Abe et al. ......................... 257/69 |
| 2008/0164500 | A1 | * | 7/2008 | Shinohara et al. ............ 257/292 |
| 2009/0021620 | A1 | | 1/2009 | Inagaki et al. |
| 2009/0303371 | A1 | | 12/2009 | Watanabe et al. |
| 2010/0090095 | A1 | | 4/2010 | Han |
| 2011/0037969 | A1 | * | 2/2011 | Spickermann et al. ...... 356/5.01 |
| 2011/0187911 | A1 | | 8/2011 | Shinohara |
| 2012/0242875 | A1 | * | 9/2012 | Nakamura .................... 348/294 |

FOREIGN PATENT DOCUMENTS

| JP | 2010-114274 | 5/2010 |
| JP | 2011-044544 | 3/2011 |
| KR | 1020060044088 A | 5/2006 |

* cited by examiner

*Primary Examiner* — Caridad Everhart
(74) *Attorney, Agent, or Firm* — Volentine & Whitt, PLLC

(57) ABSTRACT

An image sensor includes a first device isolation layer separating a plurality of pixels from one another, and a second device isolation layer disposed along inner side surfaces of parts of the first device isolation layer that extend around the pixels. The second device isolation layer delimits an active region of the semiconductor substrate. Each pixel includes a photoelectric converter, a floating diffusion region, a ground region, and a gate of a transfer transistor. The gate extends into the active region of the semiconductor substrate. The ground region is electrically connected to a ground voltage terminal.

19 Claims, 15 Drawing Sheets

IMAGE SENSOR

PRIORITY STATEMENT

This U.S. non-provisional patent application claims priority under 35 U.S.C. §119 of Korean Patent Application No. 10-2012-0058315, filed on May 31, 2012, the entire contents of which are hereby incorporated by reference.

BACKGROUND

The inventive concept relates to image sensors.

An image sensor may employ a semiconductor device for converting an optical image into an electrical signal. Image sensors that employ semiconductor devices include charge coupled devices (CCD) and CMOS image sensors (CIS). CCDs are used in video cameras and CIS are used in digital still cameras.

A CIS includes a plurality of pixels. Each pixel, in turn, includes a photodiode (PD) for sensing incident light and transistors for transferring signals produced by the photodiode to a signal processing circuit.

SUMMARY

According to one aspect of the inventive concept, there is provided an image sensor including a pixel, a first device isolation layer extending around the pixel, a second device isolation layer extending along an inner side of the first device isolation layer and delimiting an active region of a semiconductor substrate, and in which the pixel comprises a floating diffusion region, a ground region electrically connected to a ground voltage terminal, a gate of a transfer transistor extending into the active region of the semiconductor substrate, and a photoelectric converter region disposed within the semiconductor substrate as spaced apart from the gate.

According to one aspect of the inventive concept, there is provided an image sensor including a pixel, a first device isolation layer extending around the pixel, and a second device isolation layer extending along an inner side of the first device isolation layer and delimiting a first active region and a second active region of a semiconductor substrate, and in which the pixel comprises a floating diffusion region and a photoelectric converter disposed in the first active region as spaced apart from each other, a ground region, and a gate of a transfer transistor disposed in the first active region between the floating diffusion region and the photoelectric converter. Furthermore, the ground region is disposed in the second active region, is electrically connected to a ground voltage terminal, and is spaced apart from the gate of the transfer transistor.

According to still another aspect of the inventive concept, there is provided an image sensor including a plurality of pixels, a first device isolation layer extending around each of the pixels so as to separate the pixels from each other, and a second device isolation layer, and in which the first device isolation layer extends deeper into the semiconductor substrate than the second device isolation layer from a front surface of the semiconductor substrate. Furthermore, the second device isolation layer delimits at least one active region of the substrate, at a front side of the semiconductor substrate, for each of the pixels. Also, each of the pixels has a floating diffusion region and a ground region of first and second conductivity types, respectively, a photoelectric converter region of the first conductivity type, and a gate electrode extending into the at least one active region of the semiconductor substrate. The floating diffusion region and the ground region are located in the at least one active region. The photoelectric converter region constitutes a photoelectric converter that converts external light to charges, and the gate electrode constitutes a transfer transistor that transfers charges that have accumulated in the photoelectric converter.

BRIEF DESCRIPTION OF THE DRAWINGS

The inventive concept will be described below in more detail with reference to the accompanying drawings.

DETAILED DESCRIPTION OF THE PREFERRED EMBODIMENTS

Figure 1:
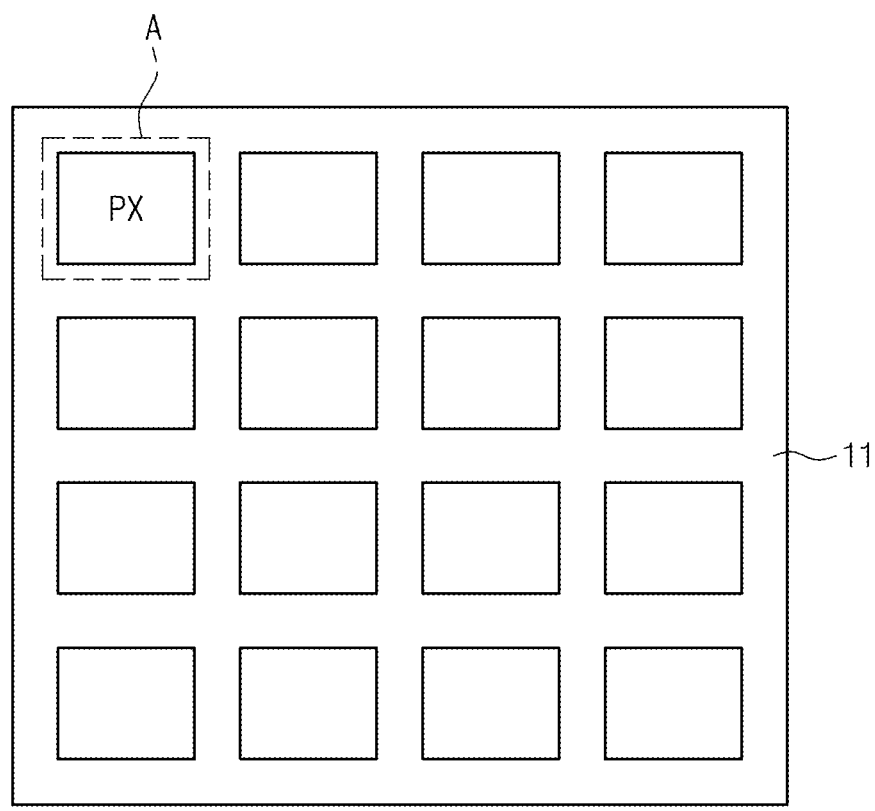
FIG. 1 is a plan view of pixels of an image sensor in accordance with the inventive concept.

Various embodiments and examples of embodiments of the inventive concept will be described more fully hereinafter with reference to the accompanying drawings. In the drawings, the sizes and relative sizes and shapes of elements, layers and regions, such as implanted regions, shown in section may be exaggerated for clarity. In particular, the cross-sectional illustrations of the semiconductor devices are schematic. Also, like numerals are used to designate like elements throughout the drawings.

It will also be understood that when an element or layer is referred to as being disposed "on" another element or layer, it can be directly on the other element or layer or intervening elements or layers may be present. In contrast, if an element or layer is referred to as being disposed "directly on" another element or layer, there would be no intervening elements or layers present. The relationship of elements and layers shown in the drawings, however, may be independent of such descriptions.

Furthermore, spatially relative terms, such as "upper" and "lower" and "front" and "back" are used to describe an element's and/or feature's relationship to another element(s) and/or feature(s) as illustrated in the figures. Thus, the spatially relative terms may apply to orientations in use which differ from the orientation depicted in the figures. Obviously, though, all such spatially relative terms refer to the orientation shown in the drawings for ease of description and are not necessarily limiting as embodiments according to the inventive concept can assume orientations different than those illustrated in the drawings when in use.

Other terminology used herein for the purpose of describing particular examples or embodiments of the inventive concept is to be taken in context. For example, the terms "comprises" or "comprising" when used in this specification specifies the presence of stated features but does not preclude the presence or additional features. The term "substrate" will generally refer to a body of material that is generally homogeneous in terms of its conductivity and serves as the base of the pixels, i.e., the "substrate" will generally be that part of the original substrate that remains after and hence, excludes, regions that have been altered by some doping process.

Embodiments of an image sensor in accordance with the inventive concept will now be described in more detail with reference to FIGS. 1-9.

Referring first to FIG. 1, an image sensor according to the inventive concept has an array of pixels PX, which may be arranged in a matrix, and a first device isolation layer 11 insulating the pixels PX from one another. That is, the pixels PX are separated from one another by the first device isolation layer 11. In this example, the first device isolation layer 11 is a trench type of device isolation layer and may be a deep trench isolation (DTI) layer. The image sensor illustrated in FIG. 1 may be a CMOS image sensor.

Figure 2:
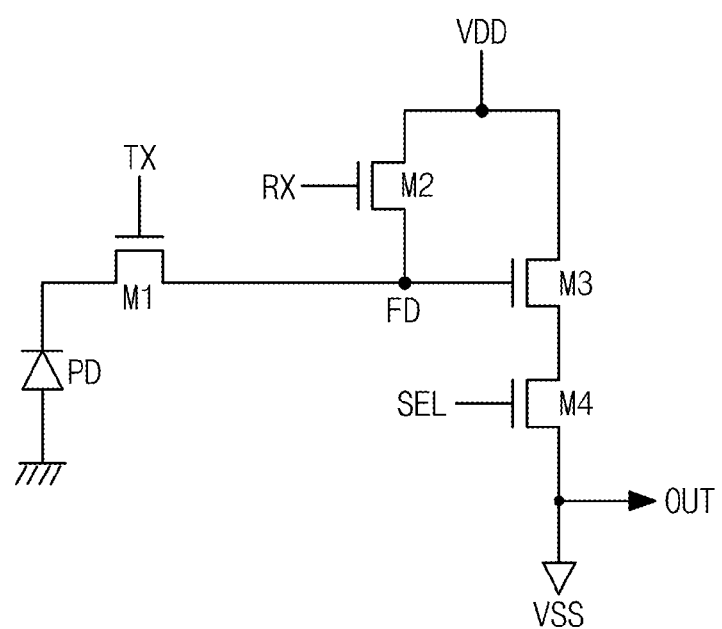
FIG. 2 is an equivalent circuit diagram of a unit pixel of the image sensor illustrated in FIG. 1.

Referring to FIG. 2, each of the pixels PX of the image sensor includes a photoelectric converter PD, a floating diffusion node FD, a plurality of transistors M, and a ground region (to be described in more detail later on).

The photoelectric converter PD detects external light and generates charges from the light. For example, the photoelectric converter PD generates and accumulates charges in an amount corresponding to the intensity of incident light. To this end, the photoelectric converter PD may comprise at least one photodetector selected from the group consisting of a photodiode, a phototransistor, a photogate and a pinned photodiode.

The transistors M may include a transfer transistor M1, a reset transistor M2, a drive transistor M3 and a select transistor M4.

In this case, the transfer transistor M1 transfers charges (or optical current) accumulated in the photoelectric converter PD to the floating diffusion node FD in response to a transfer control signal TX. The floating diffusion node FD receives and stores charges transferred by the transistor M1 from the photoelectric converter PD.

The reset transistor M2 is connected between a power supply voltage VDD and the floating diffusion node FD. The reset transistor M2 resets an electric potential of the floating diffusion node FD to a predetermined power supply voltage level VDD in response to a reset control signal RX to discharge charges stored in the floating diffusion node FD.

The drive transistor M3 functions as a source follower-buffer amplifier and generates an electrical signal corresponding to charges stored in the floating diffusion node FD. The drive transistor M3 may be referred to as a source follower transistor.

The select transistor M4 transfers an electrical signal generated by the drive transistor M3 to an output terminal OUT in response to a select control signal SEL.

Figure 3:
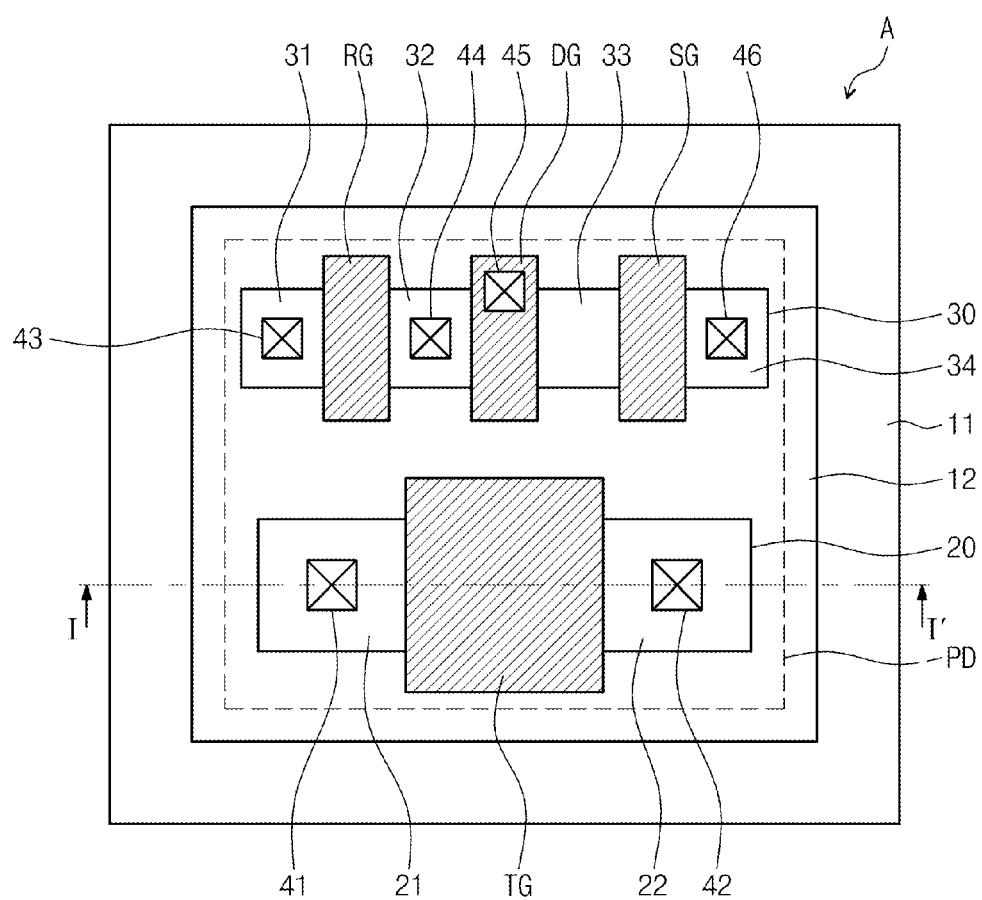
FIG. 3 is an enlarged view of region 'A' illustrated in FIG. 1 and thus, is a plan view of a unit pixel of the image sensor in accordance with the inventive concept.
Figure 4:
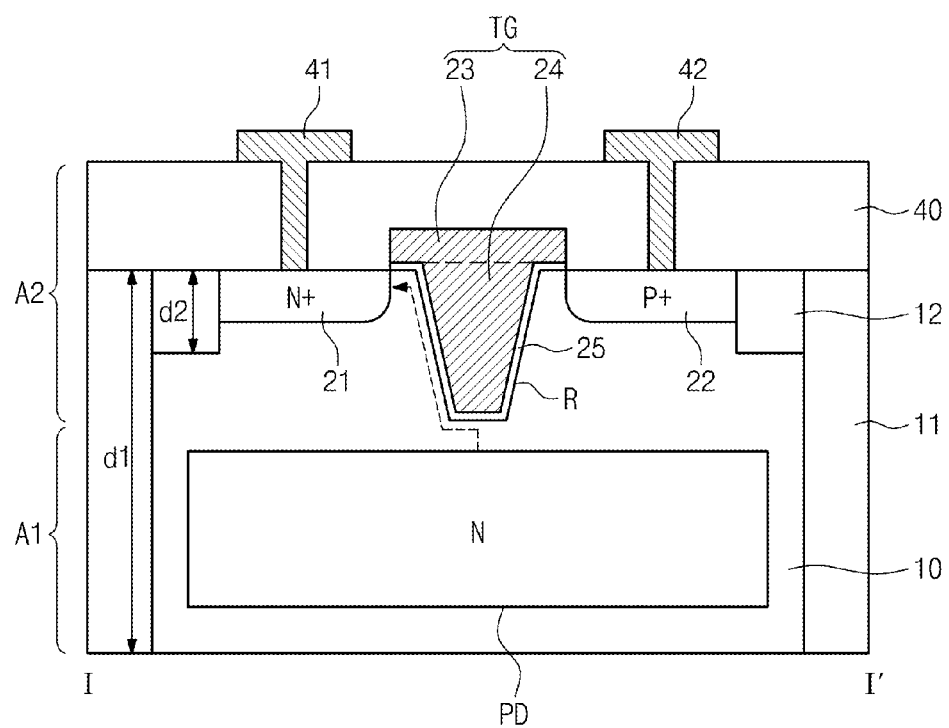
FIG. 4 is a cross-sectional view taken along line I-I' of FIG. 3.

Referring to FIGS. 3 and 4, a first embodiment of an image sensor according to the inventive concept also has a semiconductor substrate 10. The semiconductor substrate 10 may comprise a bulk silicon substrate of a first conductivity type and an epitaxial layer, also of the first conductivity type, on the bulk silicon substrate. The first conductivity type may be a P-type. Alternatively, the semiconductor substrate 10 may consist of the P-type epitaxial layer, which can be realized by removing the bulk silicon substrate on which it has been formed some time during the process of manufacturing the image sensor.

In this embodiment, each pixel PX of the image sensor includes not only the photoelectric converter PD and the transistors M1-M4 but a ground region 22 as well.

The pixel PX also has a light-receiving region A1 and a circuit region A2. The light-receiving region A1 is confined within the thickness of the semiconductor substrate 10 and includes the photoelectric converter PD. The circuit region A2 includes the transistors M1-M4 and the ground region 22.

The photoelectric converter PD in this embodiment comprises a photoelectric converter region of a second conductivity type within the semiconductor substrate 10. Thus, in this example, the second conductivity type is an N-type. In this case, the N-type photoelectric converter region joins the P-type semiconductor substrate 10 to constitute a photodiode. Furthermore, the N-type region may be of semiconductor material doped with N-type impurities. Also, the N-type region may be spaced from the first device isolation layer 11.

The image sensor may also have a second device isolation layer 12 in the semiconductor substrate 10. The second device isolation layer 12 may be constituted by the same insulating material as the first device isolation layer 11. The second device isolation layer 12 may join the first device isolation layer 11 along an inner side surface of the first device isolation layer 11. Also, the depth (d2) of the second device isolation layer 12, from a front surface of the semiconductor substrate 10, may be smaller than the depth (d1) of the first device isolation layer. In this respect, the second device isolation layer 12 may be a shallow trench isolation (STI) layer or a trench type device isolation layer formed by a local oxidation of silicon (LOCOS) process.

In any case, the second device isolation layer 12 defines a first active region 20 and a second active region 30 that are separated from each other by the second device isolation layer 12. The first active region 20 contains a floating diffusion region 21, the ground region 22 and the transfer gate TG of the transfer transistor M1. The second active region 30 contains the reset transistor M2, the drive transistor M3 and the select transistor M4.

Furthermore, the floating diffusion region 21 and the ground region 22 are separated from each other in the first active region 20. Specifically, in this example, the floating diffusion region 22 is disposed on one side of the transfer gate TG of the transfer transistor M1 and the ground region 22 is disposed on the other side of transfer gate TG of the transfer transistor M1.

The floating diffusion region 21 is of the second conductivity type. In this example, the floating diffusion region 21 is an N+-type semiconductor region comprising semiconductor material doped with impurities to produce the N+-type concentration. The floating diffusion region 21 forms the floating diffusion node FD illustrated in FIG. 2. The ground region 22 is of the first conductivity type. In this example, the ground region 22 is a P+-type semiconductor region comprising semiconductor material doped with impurities to produce the P+-type concentration.

The transfer gate TG of the transfer transistor M1 may be formed of poly silicon. The transfer gate TG of the transfer transistor M1 may include a first gate segment 23 atop the semiconductor substrate 10 and a second gate segment 24 occupying a recess R extending within the semiconductor substrate 10 from the top surface thereof. The recess R may terminate above the region of the second conductivity type constituting the photoelectric converter PD. The recess R and hence, the second gate segment 24, may extend below the level of the bottom of the second device isolation layer 12. Also, the second gate segment 24 may have sloping sidewall surfaces, as shown in the figure. As is also illustrated in FIG. 4, the first gate segment 23 may be wider than the second gate segment 24 (at least in terms of their maximum widths).

In this embodiment, the image sensor also has a gate insulating layer 25 interposed between the semiconductor substrate 10 and the transfer gate TG. The gate insulating layer 25 may be formed of silicon oxide or silicon nitride.

As mentioned above, the reset transistor M2, the drive transistor M3 and the select transistor M4 are located in the second active region 30 as spaced apart from the transfer transistor M1 by the second device isolation layer 12.

Specifically, a gate RG of the reset transistor M2, a gate DG of the drive transistor M3, a gate ST of the select transistor M4 and first through fourth semiconductor regions 31, 32, 33 and 34 forming sources and drains of the transistors M2-M4 are located in the second active region 30. In particular, the gates RG, DG, and SG of the reset transistor M2, the drive transistor M3 and the select transistor M4 are disposed on the semiconductor substrate 10. The gates RG, DG, and SG may each be formed of poly silicon.

The first through fourth semiconductor regions 31, 32, 33 and 34 are of second conductivity type. In this example, the first through fourth semiconductor regions 31, 32, 33 and 34 are N+-type semiconductor regions. The first semiconductor region 31 may be a source of the reset transistor M2 and the second semiconductor region 32 may be a drain of the reset transistor M2. The reset transistor M2 and the drive transistor M3 share the second semiconductor region 32. The second semiconductor region 32 may be a drain of the drive transistor M3 and the third semiconductor region 33 may be a source of the drive transistor M3. The drive transistor M3 and the select transistor M4 share the third semiconductor region 33. The third semiconductor region 33 may be a drain of the select transistor M4 and the fourth semiconductor region 34 may be a source of the select transistor M4.

The image sensor may also have an interlayer insulating layer 40 extending over the semiconductor substrate 10 and covering the gates TG, RG, DG and SG of the transistors M1-M4, a first contact 41 and a second contact 42 extending through the interlayer insulating layer 40 to the floating diffusion region 21 and the ground region 22, respectively and a third contact 43, a fourth contact 44, a fifth contact 45 and a sixth contact 46. The third contact 43, fourth contact 44, fifth contact 45 and sixth contact 46 extend through the interlayer insulating layer 40 to the first semiconductor region 31, second semiconductor region 32, gate DG of the third transistor M3, and fourth semiconductor region 34, respectively.

Accordingly, the floating diffusion region 21 can be electrically connected to the first semiconductor region 31, which is the source of the reset transistor M2, by the first contact 41 and the third contact 43. The floating diffusion region 21 can be electrically connected to the gate DG of the drive transistor M3 by the first, third and fifth contacts 41, 43 and 45. The ground region 22 can be electrically connected to a ground voltage terminal GND by the second contact 42. The second semiconductor region 32, which is the drain of the reset transistor M2 and the drive transistor M3, can be electrically connected to the power supply voltage VDD by the fourth contact 44. And, the fourth semiconductor region 34, which is the source of the select transistor M4, can be electrically connected to the output terminal OUT by the sixth contact 46.

In this embodiment, as described above, the photoelectric converter PD receives external light, and generates an amount of charge based on the light. Charges accumulated by the photoelectric converter PD are transferred to the floating diffusion region 21 through a channel formed along the side of and below the second gate segment 24 as represented by the dotted arrow in FIG. 4.

That is, in this embodiment, the transfer transistor M1 is composed of the N-type region of the photoelectric converter PD, the floating diffusion region 21 and the transfer gate TG. The channel formed in such a transistor M1 may have a relatively great length, in comparison to the width the transistor occupies, because the transfer gate TG has a second gate segment 24 occupying the recess R in the substrate 10.

Also, the region of the image sensor containing the photoelectric converter PD overlaps, in the vertical direction, the region containing the transistors M1-M4 and ground region 22. On the other hand, the region of the second conductivity type of the photoelectric converter PD is confined to the light-receiving region A1 inside the semiconductor substrate 10, and the transistors M1-M4 and the ground region 22 are confined to the separate circuit region A2, i.e., a region outside of the light-receiving region A1. Thus, the area of the photoelectric converter PD and, more specifically, the area of the region of the second conductivity type of the photoelectric converter PD, can be maximized in the pixel PX.

The overall operation of the pixel PX, i.e., the operations of the photoelectric converter PD and transistors M, were described in detail with reference to FIG. 2 and therefore, will not be described again in detail.

Moreover, in this embodiment, the pixels PX are separated from one another by the first device isolation layer 11. Thus, each pixel PX requires a region that can be connected to the ground voltage terminal GND. Each of the pixels PX of this embodiment includes a ground region 22, and the ground regions 22 of the pixels PX may all be connected to the ground voltage terminal GND by the second contacts 42.

Accordingly, each of the pixels PX of image sensor in accordance with the inventive concept can be connected to the ground voltage terminal GND without compromising the size of the footprint of the region of the photoelectric converter PD located within the semiconductor substrate 10.

A pixel PX of another embodiment of an image sensor in accordance with the inventive concept will now be described in more detail with reference to FIGS. 5 and 6. In this regard, mainly only the differences between this embodiment and that of FIGS. 3 and 4 will be described.

Figure 5:
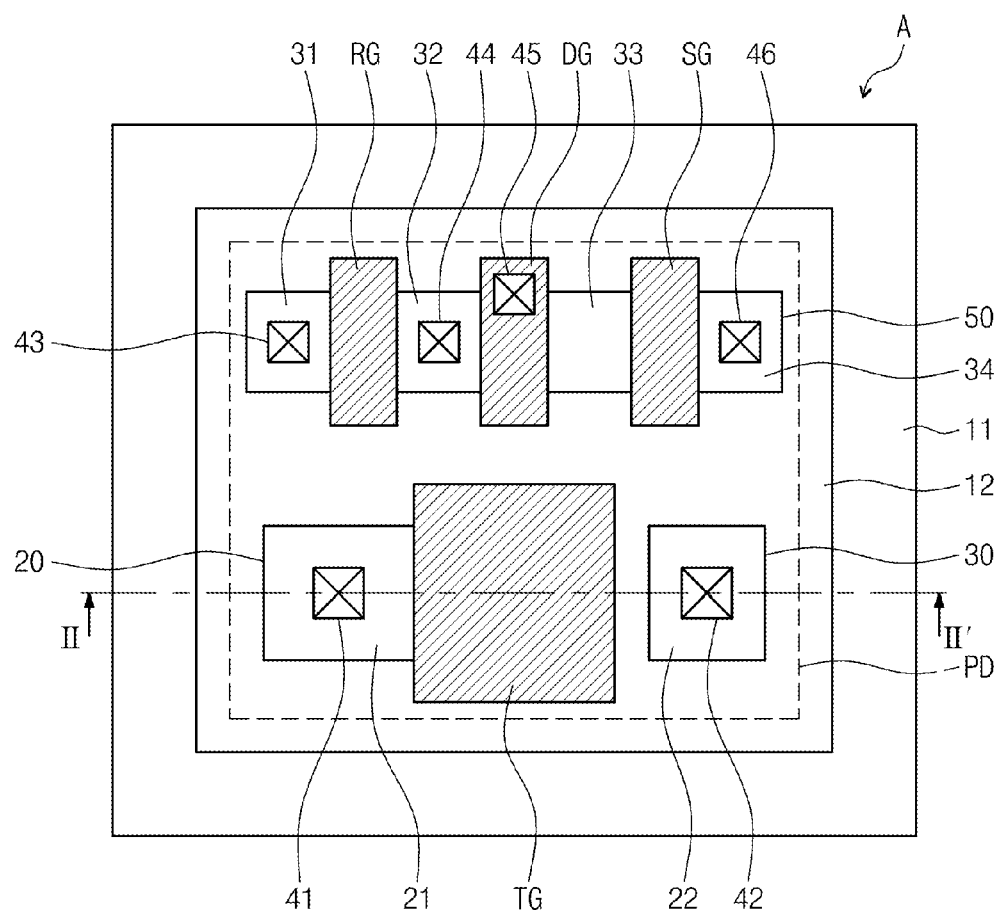
FIG. 5 is a plan view of a unit pixel of another embodiment of an image sensor in accordance with the inventive concept.
Figure 6:
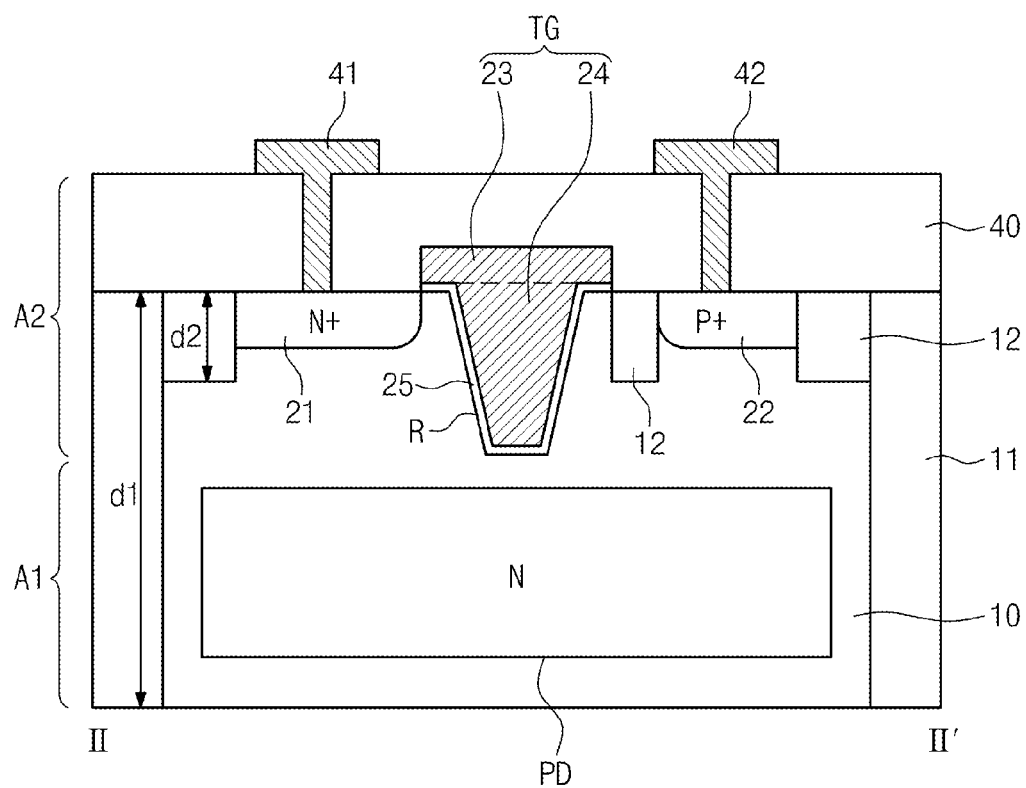
FIG. 6 is a cross-sectional view taken along line II-II' of FIG. 5.

Referring to FIGS. 5 and 6, second device isolation layer 12 divides the upper portion of the substrate 10 into and hence, defines a first active region 20, a second active region 30 and a third active region 50.

The first active region 20 contains the floating diffusion region 21 and the transfer gate TG of the transfer transistor M1, the second active region 30 contains the ground region 22, and the third active region 50 contains the reset transistor M2, the drive transistor M3 and the select transistor M4.

The diffusion region 21 is disposed to one side of the transfer gate TG of the transfer transistor M1, and the ground region 22 is spaced apart from the other side of the transfer gate TG. In this respect, the second device isolation layer 12 spaces and insulates the ground region 22 and the transfer gate TG of the transfer transistor M1 from each other.

The reason for this is as follows. The strength of an electric field formed between the transfer gate TG and the ground region 22 can be kept in check by the second device isolation layer 12 when a gate voltage is applied to the transfer gate TG. Thus, leakage current generated due to an electric field formed between the transfer gate TG and the ground region 22 can be minimized.

A pixel of still another embodiment of an image sensor in accordance with the inventive concept will now be described with reference to FIGS. 7 and 8. Again, mainly only those differences between this embodiment and the previous embodiments will be described in detail.

Figure 7:
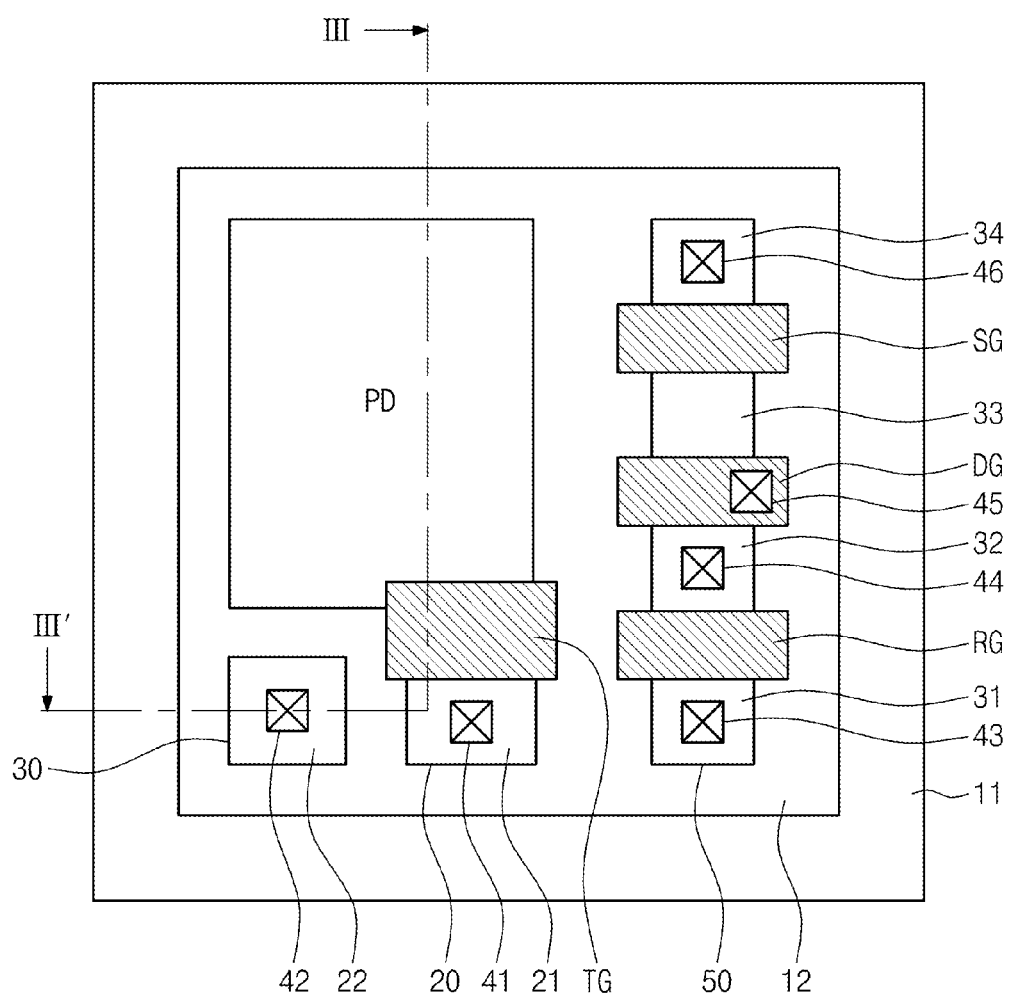
FIG. 7 is a plan view of a unit pixel of still another embodiment of an image sensor in accordance with the inventive concept.
Figure 8:
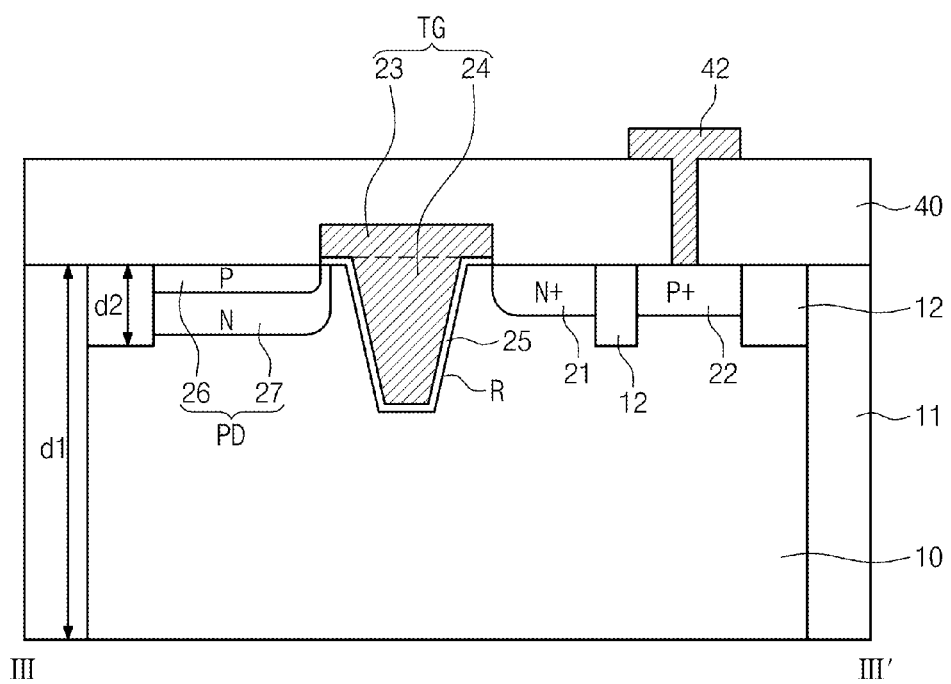
FIG. 8 is a cross-sectional view taken along line III-III' of FIG. 7.

Referring to FIGS. 7 and 8, the second device isolation layer 12 divides an upper portion of the substrate 10 into and hence, defines a first active region 20, second active region 30 and third active region 50.

The first active region 20 contains the floating diffusion region 21, the transfer gate TG of the transfer transistor M1 and the photoelectric converter PD. The transfer gate TG of the transfer transistor is interposed between the floating diffusion region 21 and the photoelectric conversion part PD in the first active region 20.

Also, in this embodiment, the photoelectric converter PD comprises, for example, a P-type semiconductor region 26 and an N-type semiconductor region 27 adjoining a lower portion of the P-type semiconductor region 26.

The transfer gate TG of the transfer transistor M1, as was the case with the previous embodiments, may include first gate segment 23 disposed atop the semiconductor substrate 10 and second gate 24 extending into the substrate 10 (within recess R). Charges generated from the photoelectric converter PD are transferred to the floating diffusion region 21 through a channel formed along the sides of and below the second segment 24 of the transfer gate TG.

The second active region 30 contains the ground region 22. The ground region 22 may be a P+-type semiconductor region. The ground region 22 and the transfer gate TG are spaced and insulated from each other by the second device isolation layer 12. As a result, leakage current generated due to an electric field formed between the transfer gate TG and the ground region 22 when a gate voltage is applied to the transfer gate TG can be minimized. The floating diffusion region 21 and the ground region 22 are likewise separated from each other by the second device isolation layer 12.

The third active region 50 contains the reset transistor M2, the drive transistor M3 and the select transistor M4.

Figure 9:
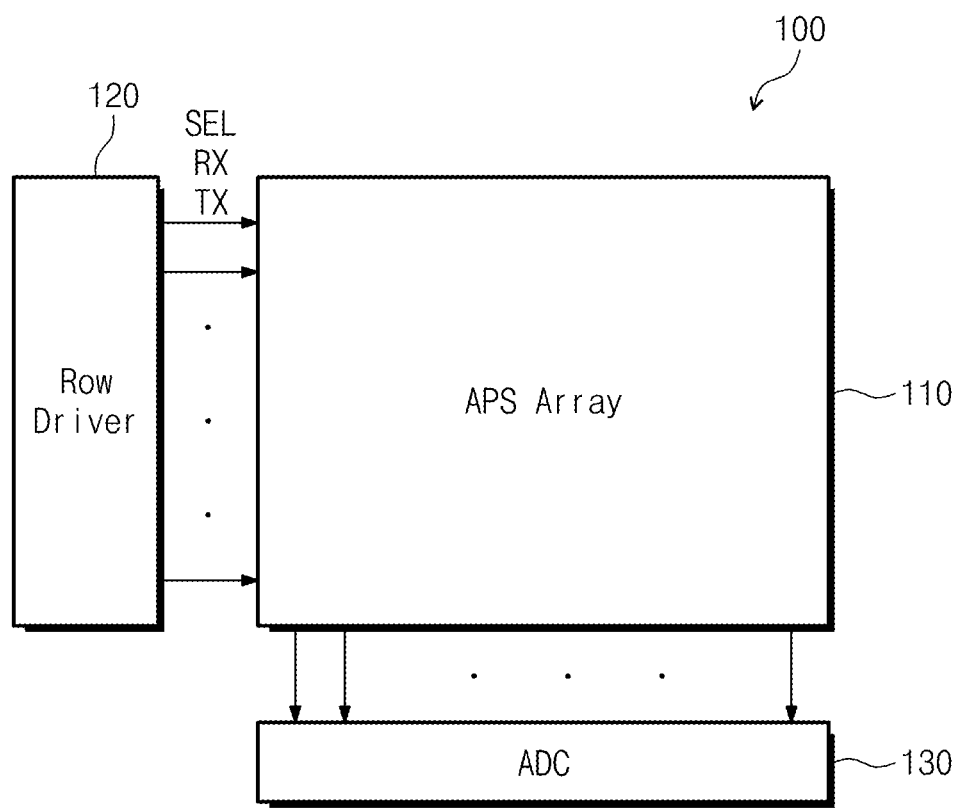
FIG. 9 is a block diagram of an image sensor in accordance with the inventive concept.

An image sensor 100 including pixels having any of the structures described above in connection with the embodiments of FIGS. 3-8 will now be described in even further detail with reference to the block diagram of FIG. 9.

The image sensor 100 includes an active pixel sensor (APS) array 110, a row driver 120 and an analog-digital converter (ADC) 130.

The APS array 110 includes a plurality of pixels arranged in a matrix, i.e., as illustrated in FIG. 1. The photoelectric converters of the APS array 110 detect external light and convert the light into an electrical signal to generate an image signal representative of characteristics of the external light.

The row driver 120 provides a select control signal SEL, a reset control signal RX and a transfer control signal TX as control signals for driving the pixels of the APS array 110. The row driver 120 can drive the APS array 110 by a row unit. The row driver 120 generates a row select signal and the APS array 110 can output a reset signal and an image signal from a selected row to the analog-digital converter 130 by the row select signal provided from the row driver 120. The reset signal is a signal corresponding to a state that the floating diffusion node FD is reset and the image signal is a signal corresponding to a state that the charges transferred from the photoelectric conversion part are accumulated in the floating diffusion node FD.

The analog-digital converter 130 can convert the image signal provided from a ramp signal generator (not shown) into a digital signal using a ramp signal Vramp. The analog-digital converter 130 correlated-double-samples a reset signal and an image signal output from the APS array 110 to convert them into a digital signal using a ramp signal.

Figure 10:
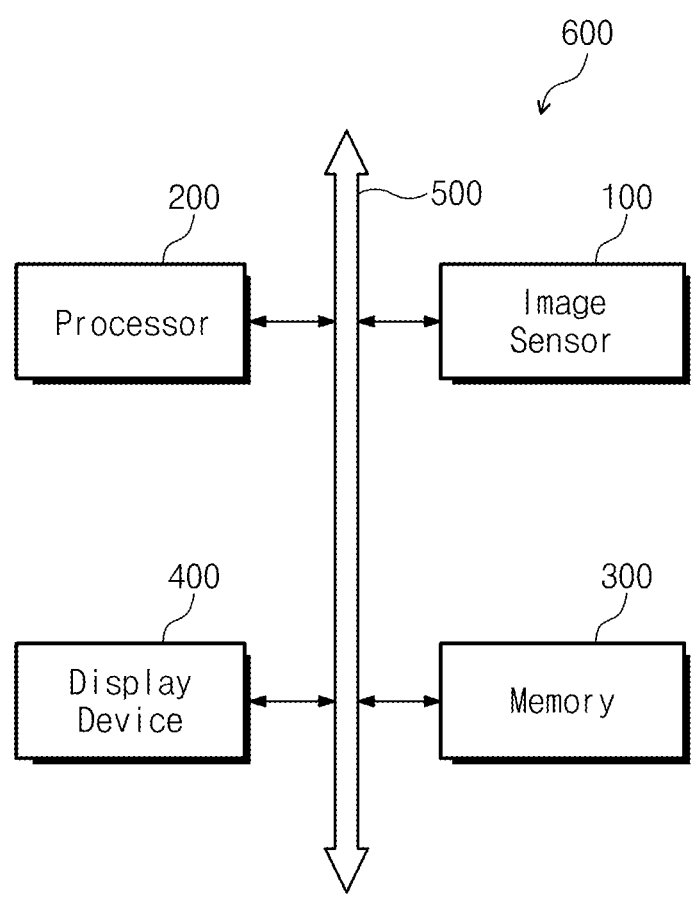
FIG. 10 is a block diagram of an electronic device including an image sensor in accordance with the inventive concept.

An electronic device 600, such as a digital camera or a mobile device, including an image sensor 100 in accordance with the inventive concept will be described with reference to FIG. 10.

In addition to the image sensor 100, the electronic device 600 includes a processor 200, a memory 300, a display device 400 and a bus 500.

The processor 200 generates a control signal that can control an operation of the image sensor 100 and the control signal is transferred to the image sensor 100 through the bus 500. The image sensor 100 captures external image information in response to the control signal provided by the processor 200. As described above, the image sensor 100 detects external light and converts the light into an electrical signal representative of the captured image, which signal may be referred to as an image signal.

The processor 200 directs the image signal to the memory 300, where it is stored, through the bus 500. The processor 200 outputs image signals stored in the memory 300 to the display device 400, and the display device 400 converts the image signals into image information and displays the image information.

FIGS. 11 through 15 show examples of multimedia devices which may employ an image sensor in accordance with the inventive concept.

Figure 11:
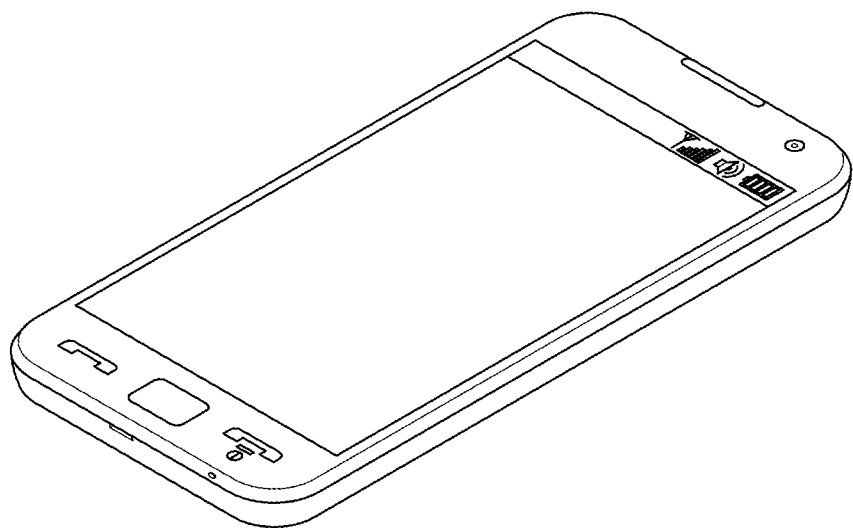
FIG. 11 is a perspective view of a phone which employs an image sensor in accordance with the inventive concept.
Figure 12:
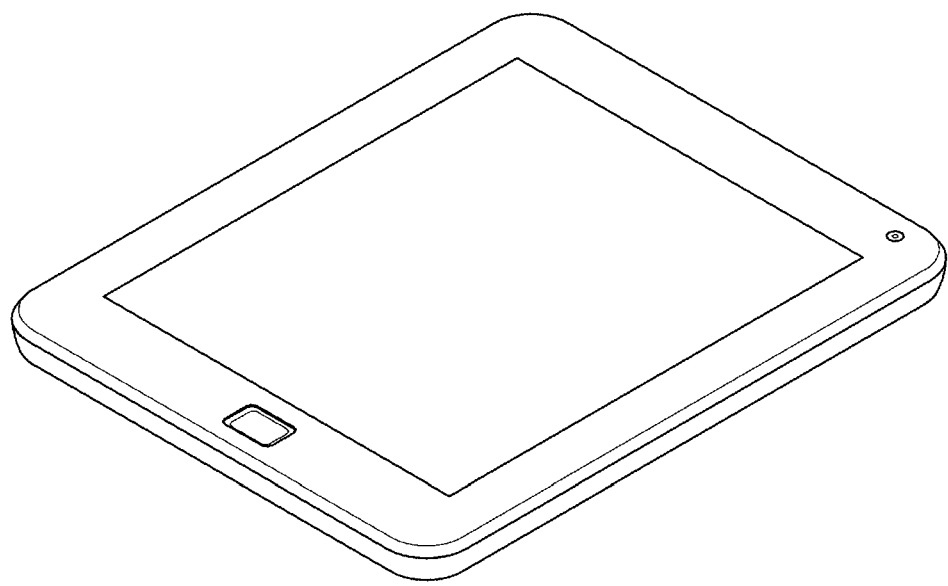
FIG. 12 is a perspective view of a tablet which employs an image sensor in accordance with the inventive concept.
Figure 13:
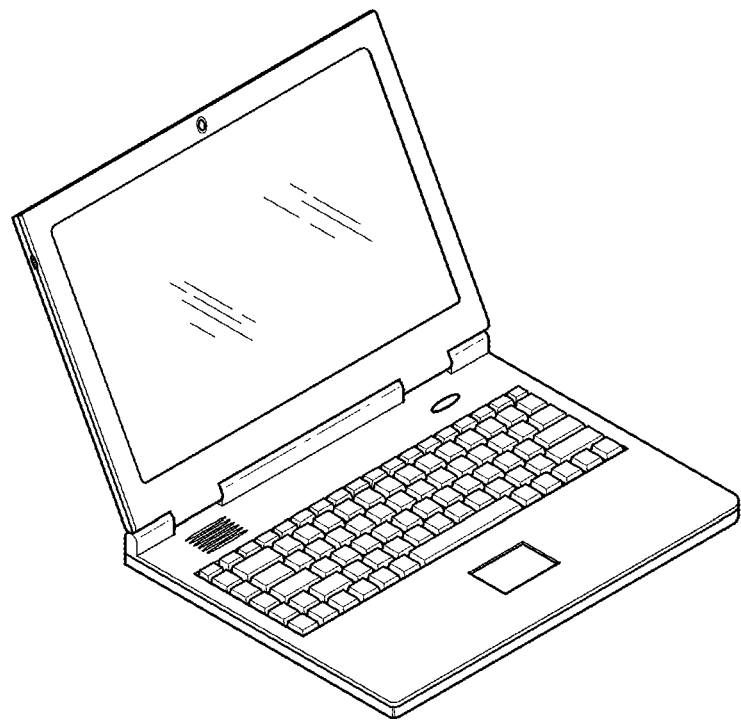
FIG. 13 is a perspective view of a portable computer which employs an image sensor in accordance with the inventive concept.
Figure 14:
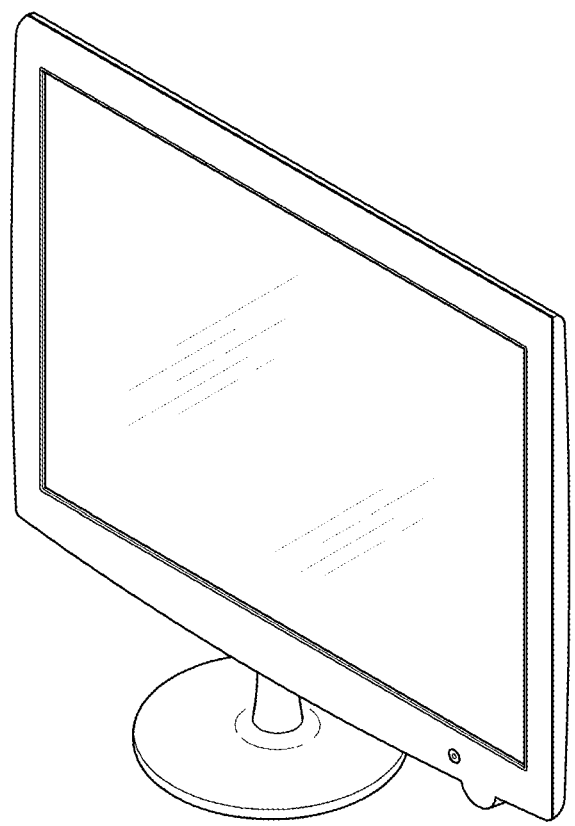
FIG. 14 is a perspective view of a display of a television or the like which employs an image sensor in accordance with the inventive concept.
Figure 15:
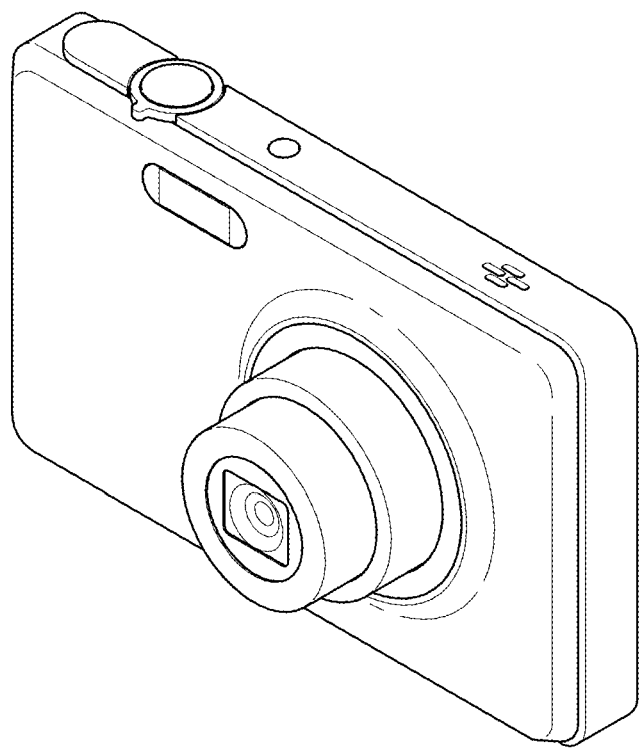
FIG. 15 is a perspective view of a digital camera which employs an image sensor in accordance with the inventive concept.

Turning to these figures, an image sensor in accordance with the inventive concept can be employed by a mobile phone, e.g., a smart phone, 1000 as illustrated in FIG. 11, and can be employed by a tablet 2000 as illustrated in FIG. 12. An image sensor in accordance with the inventive concept can be employed by a portable computer 3000, e.g., a notebook, as illustrated in FIG. 13 and can be employed by a television 4000, e.g., a flat panel TV, as illustrated in FIG. 14. An image sensor can be employed by a digital camera (including one having video capability) or a digital camcorder 5000 as illustrated in FIG. 15.

As described above, an image sensor according to one aspect of the inventive concept can maximize the area over which an image (external light) can be captured by a photoelectric converter of the sensor.

According to another aspect of the inventive concept, each pixel of the image sensor may include a ground region electrically connected to a ground voltage terminal.

According to still another aspect of the inventive concept, leakage current can be minimized.

Finally, embodiments of the inventive concept and examples thereof have been described above in detail. The inventive concept may, however, be embodied in many different forms and should not be construed as being limited to the embodiments described above. Rather, these embodiments were described so that this disclosure is thorough and complete, and fully conveys the inventive concept to those skilled in the art. Thus, the true spirit and scope of the inventive concept is not limited by the embodiment and examples described above but by the following claims.

What is claimed is:

1. An image sensor comprising:
a pixel;
a first device isolation layer extending around the pixel;
a second device isolation layer extending along an inner side of the first device isolation layer and separating a plurality of active regions of a semiconductor substrate in the pixel from one another, and
wherein the pixel comprises a floating diffusion region and a ground region,
a gate of a transfer transistor extending into the active region of the semiconductor substrate,
a photoelectric converter region disposed within the semiconductor substrate as spaced apart from the gate, and
at least one other transistor integrated in a circuit with the transfer transistor, the at least one other transistor including source and drain regions,
wherein the ground region is disposed in one of the active regions and is electrically connected to a ground voltage terminal, and
the source and drain regions of the at least one other transistor are disposed in another of the active regions.

2. The image sensor of claim 1, wherein the floating diffusion region is disposed on one side of the gate of the transfer transistor and the ground region is disposed on the other side of the gate of the transfer transistor.

3. The image sensor of claim 1, wherein the first and second device isolation layers are of the same insulating material.

4. The image sensor of claim 1, wherein both the first device isolation layer and the second device isolation layer extend into the semiconductor substrate in a direction from a front surface of the substrate towards a back surface of the substrate, and the first device isolation layer extends deeper into the semiconductor substrate than the second device isolation layer from the front surface of the semiconductor substrate.

5. The image sensor of claim 4, wherein the gate extends to a level below that of the second device isolation layer.

6. The image sensor of claim 1, wherein the semiconductor substrate has a first conductivity type and the photoelectric converter region has a second conductivity type.

7. The image sensor of claim 6, wherein the floating diffusion region has the second conductivity type and the ground region has the first conductivity type.

8. The image sensor of claim 1, wherein the floating diffusion region is disposed on one side of the gate of the transfer transistor and the ground region is disposed on the other side of and spaced from the gate of the transfer transistor.

9. The image sensor of claim 8, wherein the gate of the transfer transistor extends in one of the active regions, and the ground region is disposed in another of the active regions, such that the gate of the transfer transistor and the ground region are separated from each other by the second device isolation layer.

10. An image sensor comprising:
a pixel;
a first device isolation layer extending around the pixel; and
a second device isolation layer extending along an inner side of the first device isolation layer and separating a first active region, a second active region, and a third active region of a semiconductor substrate in the pixel from one another, and wherein the pixel comprises a floating diffusion region and a photoelectric converter disposed in the first active region as spaced apart from each other,
a ground region,
a gate of a transfer transistor disposed in the first active region between the floating diffusion region and the photoelectric converter, and
at least one other transistor integrated in a circuit with the transfer transistor, the at least one other transistor including source and drain regions, and
wherein the ground region is disposed in the second active region,
the ground region is electrically connected to a ground voltage terminal, and
the source and drain regions of the at least one other transistor are disposed in the third active region.

11. The image sensor of claim 10, wherein the photoelectric converter part comprises a P-type semiconductor region and an N-type semiconductor region adjoining the P-type semiconductor region.

12. An image sensor comprising:
a plurality of pixels;
a first device isolation layer extending around each of the pixels so as to separate the pixels from each other; and
a second device isolation layer, and
wherein both the first device isolation layer and the second device isolation layer extend into the semiconductor substrate in a direction from a front surface of the substrate towards a back surface of the substrate, the first device isolation layer extends deeper into the semiconductor substrate than the second device isolation layer from the front surface of the semiconductor substrate, and the second device isolation layer separates a plurality of active regions of the substrate, at a front side of the semiconductor substrate, from each other in each of the pixels,
each of the pixels has a floating diffusion region and a ground region of first and second conductivity types, respectively, a photoelectric converter region of the first conductivity type, a gate electrode extending into one of the active regions of the semiconductor substrate, and a plurality of transistors,
the floating diffusion region and the ground region are each located in one of the active regions,
the plurality of transistors are located at another of the plurality of active regions separated by the second device isolation layer from the active region or regions into which the gate electrode extends and in which the floating diffusion and ground regions are located,
the photoelectric converter region constitutes a photoelectric converter that converts external light to charges, and
the gate electrode constitutes a transfer transistor that transfers charges that have accumulated in the photoelectric converter.

13. The image sensor of claim 12, further comprising an insulating layer extending over the front surface of the semiconductor substrate, and a contact of electrically conductive material extending through the insulating layer and into contact with the ground region.

14. The image sensor of claim 12, further comprising an insulating layer extending over the front surface of the semiconductor substrate, and a plurality of contacts of electrically conductive material extending through the insulating layer and into contact with the transistors, respectively.

15. The image sensor of claim 12, wherein the plurality of transistors are integrated in a circuit with the transfer transistor.

16. The image sensor of claim 12, wherein the substrate is of the first conductivity type,
the photoelectric converter region is disposed within the semiconductor substrate as spaced from the gate of the transfer transistor such that the photoelectric converter region and a portion of the semiconductor substrate constitute the photoelectric converter,
the floating diffusion region is disposed between one side of the gate of the transfer transistor and the second device isolation layer, and the ground region is disposed on the other side of the gate of the transfer transistor, and
a channel region of the transfer transistor is defined between the photoelectric converter region and the floating diffusion region adjacent a bottom and said one side of the gate.

17. The image sensor of claim 16, wherein the photoelectric converter is a diode disposed on one side of the gate of the transfer transistor and is constituted by the photoelectric converter region and a region of the first conductivity type adjoining photoelectric converter region, and
the floating diffusion region and the ground region are disposed on the other side of the gate of the transfer transistor with the floating diffusion region being disposed closer to the gate than the ground region.

18. The image sensor of claim 16, wherein the second device isolation layer has, for each of the pixels, a section that extends into the semiconductor substrate between the ground region and said other side of the gate of the transfer transistor, such that the active region into which the gate of the transfer transistor extends is separated by the second device isolation layer from the active region in which the ground region is located.

19. The image sensor of claim 18, wherein the second device isolation layer has, for each of the pixels, a section that extends into the semiconductor substrate between the floating diffusion region and the ground region, such that the active region in which the floating diffusion region is located is separated by the second device isolation layer from the active region in which the ground region is located.

* * * * *